United States Patent [19]

Minnis

[11] 4,114,115

[45] Sep. 12, 1978

[54] COMPANDOR APPARATUS

[75] Inventor: Thomas R. Minnis, Mountain View, Calif.

[73] Assignee: California Microwave, Inc., Sunnyvale, Calif.

[21] Appl. No.: 738,835

[22] Filed: Nov. 4, 1976

[51] Int. Cl.² ............................................ H04B 1/64
[52] U.S. Cl. ..................................... 333/14; 330/85; 330/86; 330/132; 330/141
[58] Field of Search ..................... 333/14; 330/85, 86, 330/132, 141, 275 D; 325/42, 65, 62; 179/1 P, 15 AV

[56] References Cited

U.S. PATENT DOCUMENTS

| | | | |
|---|---|---|---|
| 3,769,611 | 10/1973 | Scaggs | 333/14 |
| 3,795,876 | 3/1974 | Takahashi et al. | 333/14 |
| 3,903,485 | 9/1975 | Dolby | 333/14 |
| 3,978,409 | 8/1976 | Dolby et al. | 333/14 X |
| 4,025,723 | 5/1977 | Blackledge | 333/14 X |

Primary Examiner—Paul L. Gensler
Attorney, Agent, or Firm—Schatzel & Hamrick

[57] ABSTRACT

Compandor apparatus including a compressor comprised of an operational amplifier having a plurality of gain controlling feedback paths that are respectively responsive to different portions of the input frequency spectrum, and an expandor comprised of an operational amplifier having a plurality of gain controlling circuits that are respectively responsive to different portions of the input frequency spectrum.

18 Claims, 7 Drawing Figures

Fig_1
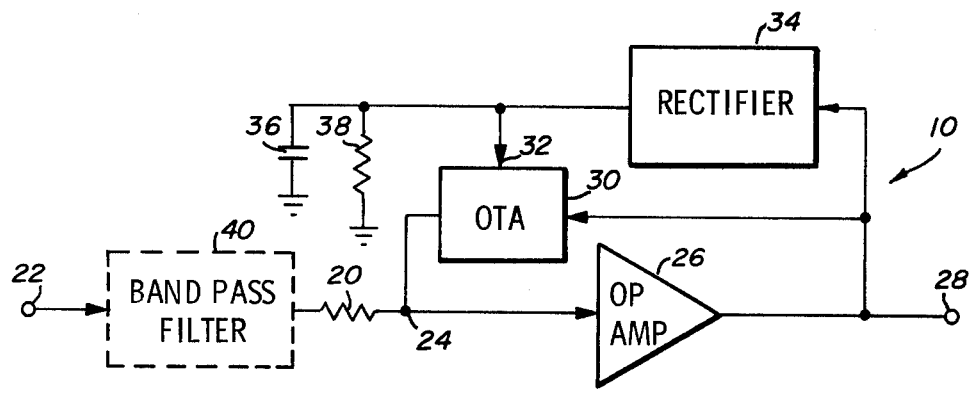
Fig_2 PRIOR ART
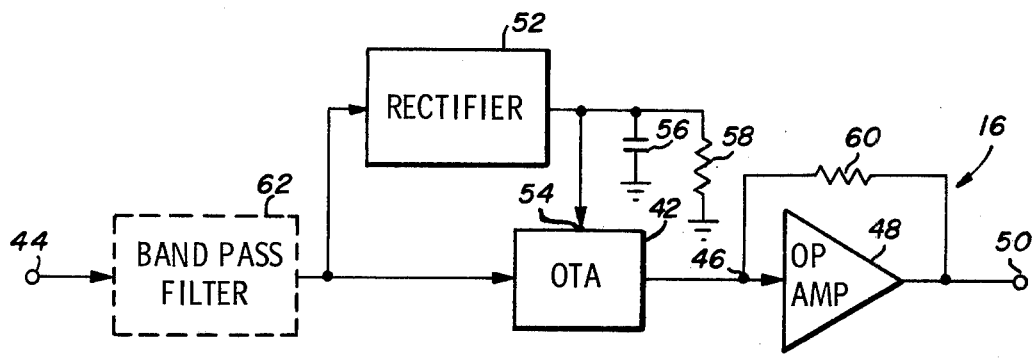
Fig_3 PRIOR ART

COMPANDOR APPARATUS

BACKGROUND OF THE INVENTION

1. Field of the Invention

The present invention relates generally to wave transmission apparatus, and more particularly to an improved compandor with improved signal-to-noise ratio and decreased distortion.

2. Description of the Prior Art

Signal transmission and recording apparatus have a dynamic range that is limited for low level signals by the noise in the system, and by distortion for high level signals. Since signals to be transmitted or recorded often have a larger dynamic range than that of the system, compandors, such as the one shown generally in FIG. 1 of the drawing, have been used for many years. The typical prior art compandor includes a compressor 10 which compresses the dynamic range of the input signal prior to transmission or recording, and an expandor 16 which expands the signal upon reception or playback to its original dynamic range.

A compressor typical of the prior art is shown in FIG. 2. The compressor includes a resistor 20, an operational amplifier 26, an operational transconductance amplifier (OTA) 30, a rectifier 34, a capacitor 36 and a resistor 38. The resistor 20 is connected between an input terminal 22 and the current summing terminal 24 of the operational amplifier 26, whose output is connected to an output terminal 28. The OTA has three terminals, an input, an output, and a control terminal 32. The input terminal of the OTA 30 is connected to the output terminal 28, and the output terminal is connected to the current summing terminal of the operational amplifier 24. The rectifier 34 is connected between the output terminal 28 and the OTA control terminal 32. The capacitor 36 and the resistor 38 are each connected from the OTA control terminal 32 to a ground.

In operation, the gain or the loss effected in an input signal impressed upon the input terminal 22 is a function of the gain of the operational amplifier 26. This gain is determined by the ratio of the effective resistance of the OTA 30 to the series resistance 20. The effective resistance of the OTA, which is inversely proportional to its conductance, is inversely proportional to the voltage impressed upon the control terminal 32. This control voltage is derived by rectifying the output signal on the output terminal 28. The control voltage is filtered by the capacitor 36. As the input signal level on terminal 22 increases, so will the output level at terminal 28. The increased output level, however, will decrease the amplifier gain so that the output level, although increasing, will not increase as fast as the input signal and thus,, will be compressed. The combination of the capacitor 36 and the resistor 38 determine the compressor time constant. This time constant and the use of a band pass filter 40 will both be discussed later.

An expandor typical of the prior art is shown in FIG. 3. The expandor includes an OTA 42, an operational amplifier 48, a rectifier 52, a capacitor 56, a resistor 58 and a feedback resistor 60. The OTA 42 has three terminals, an input, an output, and a control terminal 54. The OTA input is connected to input terminal 44. The OTA output is connected to the current summing input terminal 46 of the operational amplifier 48 whose output is connected to an output terminal 50. The rectifier 52 is connected between the input terminal 44 and the control terminal 54 of the OTA 42. The capacitor 56 and the resistor 58 are each connected from the OTA control terminal 54 to a ground. The resistor 60 is the feedback component of the amplifier 48, connected between the amplifier input terminal 46, and the output terminal 50.

In operation, the rectifier 52 rectifies the input signal at terminal 44. The rectified signal is then filtered by the capacitor 56 and applied to the control terminal 54 of the OTA 42. The gain or the loss of the expandor is proportional to the ratio of the conductance of the OTA 42 to the conductance of the feedback resistor 60. As the input signal at terminal 44 increases, so will the control voltage at terminal 54, thereby increasing the conductance of the OTA 42 and thus the gain of the expandor. As a result of the output signal at 50 will increase more than the input signal at 44, and will thus be expanded. The combination of the capacitor 56 and the resistor 58 determine the expandor time constant. This time constant is usually made similar to the time constant of the compressor.

A major problem of prior art devices is the choice of this time constant. If a high level signal should pass through the facility, the high level signal will produce a large voltage output from the rectifiers and increase the conductance of the OTAs. This will decrease the overall gain of the compressor and increase the overall gain of the expandor. Should the time constants be made long and a large signal, as discussed above, be followed by a very low level signal, the compandor will be unable to follow the change; in other words, it will have a long "hang time." The effect is that the compressor will tend to further decrease the already low signal amplitude and thus decrease the system signal-to-noise ratio. The expandor will also be slow in following the signal change and will continue to have a high gain. This high gain will amplify the facility noise and produce what is called a "noise tail."

Conversely, if the system time constant were to be made very short, the system response will be very rapid, but the capacitors will no longer be able to fully filter the low frequency signals, and the ripple on the OTA control terminals will modulate the signal passing through the compandor. In other words, the compandor gain will flow the individual cycles of the low frequency components rather than their envelope. This is undesirable as it tends to produce distortion. Further details of the prior art compandor shown in FIGS. 2 and 3 can be found in Signetics' preliminary specifications of the NE570/571, dated February, 1975.

One prior art solution uses several compressors of the type shown in FIG. 2. Each of the compressors has an associated band pass filter 40 tuned to a different portion of the spectrum and each has a different compressor time constant; the lower frequency compressors of course having the longest time constants. The filter-compressor elements are connected in parallel. A similar parallel combination of filter-expandors, such as the expandor and the band pass filter 62 of FIG. 3, is used at the receiving end of the system. The difficulty with this approach is that in the crossover regions of the filters, the phase shifts of each of the branches do not track. Thus, a signal near the band limit will pass through two different compressor or expandor elements, each with a different phase shift or delay, and when summed at the output the components might tend to add in phase to reinforce each other or add out of phase and cancel each other. This produces distortion and signal drop outs.

Another prior art solution is disclosed in the U.S. patent to Winter, U.S. Pat. No. 3,930,208. This approach combines filter-compressor elements (and also the filter-expandor elements) in series rather than in parallel. In this arrangement the phase shifts introduced by the filters are of no consequence to the operation of the compandor. Although somewhat of an improvement over the apparatus described above, this approach still uses filters in the signal path and thus still introduces some phase shift, which may have to be compensated for in order to meet envelope delay distortion specifications for the channel.

SUMMARY OF THE PRESENT INVENTION

It is therefore a principal object of the present invention to provide an improved compandor having lower distortion and improved signal-to-noise ratio without introducing phase shift or distortion caused by filters in the signal path.

Briefly, a preferred embodiment of a compandor in accordance with the present invention is comprised of a novel compressor which is coupled through a suitable transmission medium to a novel expandor. The compressor is comprised of an operational amplifier having a plurality of parallel connected feedback circuits. One of the feedback circuits includes a low pass filter for passing the low frequency components in the feedback output signal, a precision rectifier for rectifying the low frequency component signals, and a filter having a long time constant for filtering the rectified signal to develop a signal that is suitable for use in controlling a first gain control device used to control the gain of the amplifier. Another of the feedback circuits includes a high pass filter for passing the high frequency components of the output signal, a precision rectifier for rectifying the high frequency component signals, and a filter having a short time constant for filtering the rectified signal to develop a signal that is suitable for use in controlling a second gain control device used to control the gain of the amplifier.

The expandor is comprised of an operational amplifier having a plurality of parallel connected gain control circuits. One of the gain control circuits includes a low pass filter for passing the low frequency components of the input signal, a precision rectifier for rectifying the low frequency component signals, and a filter having a long time constant for filtering the rectified signal to develop a signal that is suitable for use in controlling a first gain control device used to control the gain of the amplifier. Another of the gain control circuits includes a high pass filter for passing the high frequency components of the input signal, a precision rectifier for rectifying the high frequency component signals, a filter having a short time constant for filtering the rectified signal to develop a signal that is suitable for use in controlling a gain control device used to control the gain of the amplifier.

A principal advantage of the present invention is that plural time constant determining networks are used to increase the instantaneous signal-to-noise ratio by providing a variable network hang time.

Another advantage of the present invention is that no filter elements are used in the main signal path thus eliminating any associated phase shift and distortion in the compressed and expanded signals.

These and other objects and advantages of the present invention will no doubt become apparent to those of ordinary skill in the art after having read the following detailed description of the preferred embodiment illustrated in the several figures of the drawing.

IN THE DRAWING

FIG. 1 is a block diagram generally illustrating the principal components of a compandor;

FIG. 2 is a block diagram generally illustrating a prior art compressor circuit of the type used in a compandor;

FIG. 3 is a block diagram generally illustrating a prior art expandor circuit of the type used in a compandor;

DETAILED DESCRIPTION OF THE PREFERRED EMBODIMENT

Figure 4:
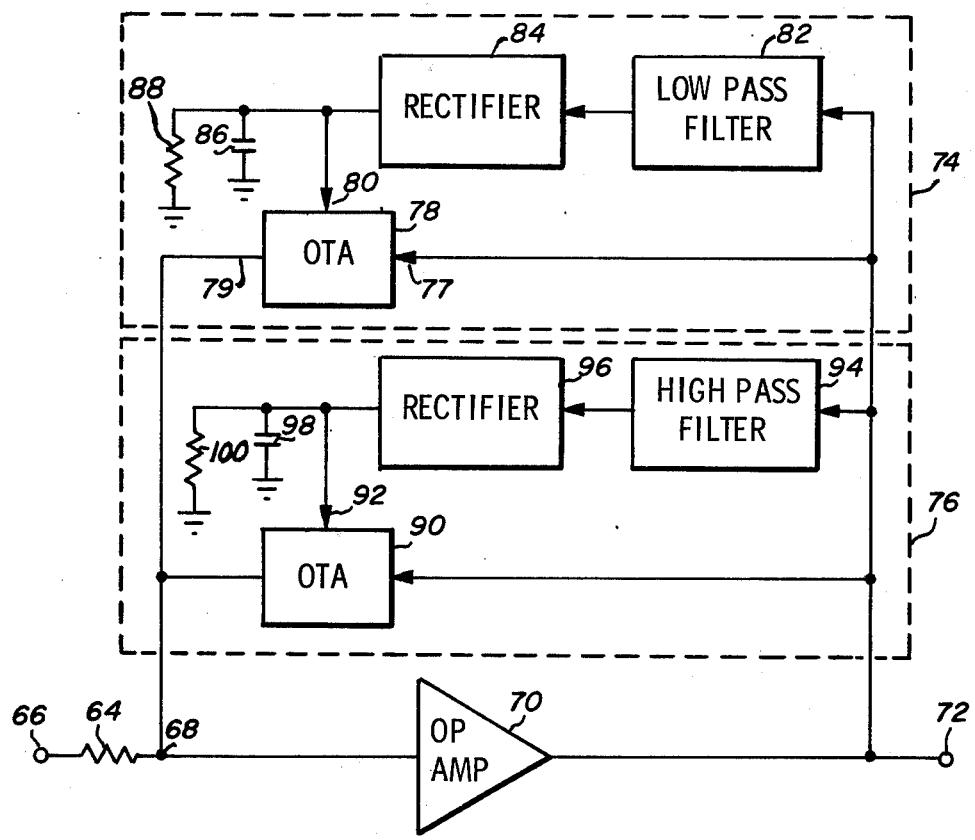
FIG. 4 is a block diagram generally illustrating a compressor circuit in accordance with the present invention.

Referring now to the drawing, the principal components of a compandor are shown in FIG. 1 and include a compressor 10 which compresses the dynamic range of an input signal to meet the requirements of a transmission or recording medium, and an expandor 16 which reconstructs the compressed signal. The prior art compressor and expandor circuits shown in FIGS. 2 and 3 have been discussed above.

Turning to FIG. 4 of the drawing, there is shown a preferred embodiment of a compressor circuit which includes a resistor 64, an operational amplifier 70, a low frequency band gain control circuit 74, and a high frequency band gain control circuit 76. The resistor 64 is connected between an input terminal 66 and the current summing terminal 68 of operational amplifier 70. The amplifier output is connected to an output terminal 72. The two gain control circuits are each connected in the feedback path of the operational amplifier 70, between the amplifier input terminal 68 and the output terminal 72. Amplifier 70 is a conventional high gain operational amplifier or summing amplifier. The gain of the compressor is proportional to the conductance of resistor 64 divided by the sum of the conductance of the low frequency band gain control circuit 74 and the conductance of the high frequency band gain control circuit 76.

The low frequency band gain control circuit 74 includes a linear multiplier or operational transconductance amplifier (OTA) 78, a low pass filter 82, a precision rectifier 84, a capacitor 86, and a resistor 88. OTA 78 has three terminals, an input 77, an output 79, and a control terminal 80. Terminal 77 is connected to terminal 72, and terminal 79 is connected to the amplifier current summing terminal 68. The low pass filter 82 is connected between the output terminal 72 and the input side rectifier 84. The output side of rectifier 84 is connected to the OTA control terminal 80 and to a time constant determining circuit including the capacitor 86 and the resistor 88.

The low pass filter 82 is a single pole device designed to pass signals with frequencies less than the filter cutoff frequency. The rectifier 84 is an ideal detector or rectifier; ideal in the sense that it responds to very low level signals. The rectifier is also preferably of the full wave type. The linear multiplier or OTA 78 is a device of conventional configuration having an effective conductance between its input terminal 72 and its output terminal 68 which is a function of the control signal applied to its control terminal 80. The capacitor 86 is of the low leakage variety and its value, and that of resistor 88, are chosen to provide the smallest time constant compatible with the maximum distortion acceptable at the lowest frequency of operation.

The low pass filter 82 operates to filter a portion of the output signal at 72 so as to pass only those signals having frequencies below its cut-off frequency. This signal is rectified by the precision rectifier 84, filtered by capacitor 86 and applied to control terminal 80 of the OTA 78. Thus, as the components of the output signal below the cut-off frequency of filter 82 increase, the conductance of the OTA 78 is increased and thereby tends to cause the gain of amplifier 70 to be decreased.

The high frequency band gain control circuit 76 includes an OTA 90, a high pass filter 94, a precision rectifier 96, a capacitor 98, and a resistor 100. The input of OTA 90 is connected to the output terminal 72, and the OTA output is connected to the amplifier current summing terminal 68. OTA 90 also includes a control terminal 92. The high pass filter 94 is connected between the output terminal 72 and the input side of the precision rectifier 96. The output side of precision rectifier 96 is connected to the OTA control terminal 92 and to a time constant determining circuit including the capacitor 98 and the resistor 100 connected together in parallel.

The high pass filter 94 is a single pole device designed to pass signals with frequencies greater than the filter cut-off frequency. The cut-off frequencies of the high pass filter 94 and the low pass filter 82 are adjusted to provide a constant level out for a given level of input signal which does not vary with frequency. The time constant determined by the capacitor 98 and the resistor 100 is set to provide the maximum acceptable distortion at the cut-off point of the high pass filter 94. The high pass filter 94 operates to filter a portion of the output signal developed at 72, so as to pass to precision rectifier 96 only signals having frequencies above its cut-off frequency. This signal is rectified by precision rectifier 96, filtered by capacitor 98, and applied to the control terminal 92 of the OTA 90. Thus, as the components of the compressed output signal which are above the high frequency cut-off of filter 94 increase, the conductance of the OTA 90 is increased, and thereby tends to cause the gain of amplifier 70 to be decreased.

Since the gain of the compressor is inversely proportional to the sum of the conductances of the OTAs 78 and 90, which are respectively proportional to the energy passing through the low pass filter 82 and the high pass filter 94, the overall gain of the compressor is inversely proportional to the signal level at output terminal 72. Thus, as the input signal level increases, so does the output level but at a slower rate, thus compressing the signal.

The overall compressor time constant is determined by the relationship of the high frequency energy present in the signal to the low frequency energy present therein. If the energy is predominantly in the upper frequency spectrum, the compressor time constant will be short, however, if the energy is predominantly in the lower frequency spectrum, the compressor time constant will be longer. Thus, although the time constant of the compressor is a function of the spectral distribution of the energy in the input signal, no filtering is used in the main signal path and thus no filter delay or distortion is introduced by the compressor.

Figure 5:
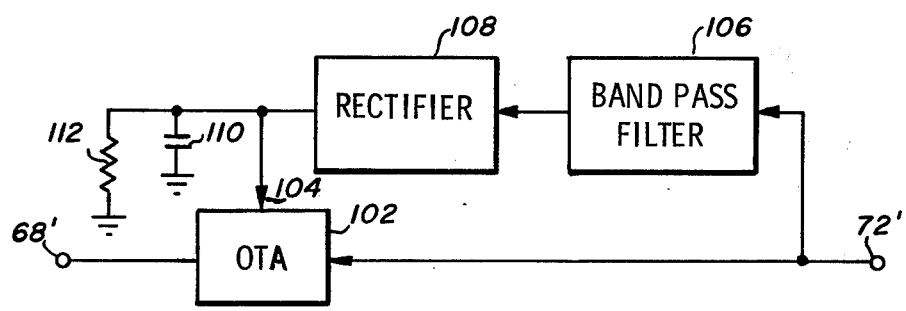
FIG. 5 is block diagram generally illustrating a medium freuqency band gain control circuit for use in the compressor circuit shown in FIG. 4.

FIG. 5 shows a mid-frequency band gain control circuit which could be used with the compressor of FIG. 4. The mid-frequency band gain control circuit includes an OTA 102, a band pass filter 106, a precision rectifier 108, a capacitor 110, and a resistor 112. The input of the OTA 102 is connected to an output terminal 72', and the OTA output is connected to an input terminal 68'. The band pass filter 106 is connected between the output terminal 72' and the input side of the precision rectifier 108. The output side of precision rectifier 108 is connected to a control terminal 104 of the OTA 102 and to the filter-time constant network comprising the parallel combination of capacitor 110 and resistor 112. Filter 106 is a single pole, band pass filter designed to pass signals lying between the cut-off frequencies of the low pass filter 82 and the high pass filter 94.

The terminals 68' and 72' of FIG. 5 are connected to the terminals 68 and 72, respectively, of FIG. 4. The cut-off frequencies of the low pass filter 82, the high pass filter 94, and the band pass filter 106 are adjusted to provide a constant level for a given level of input signal that is independent of the input frequency. The filter 106 operates to filter a portion of the output signal developed at terminal 72 so as to pass to rectifier 108 only those signals having frequencies within it pass band. This signal is rectified by the precision rectifier 108, filtered by the capacitor 110 and applied to the control terminal 104 of the OTA 102. Thus, as the components of the output signal within the pass band of the filter 106 increase, the conductance of the OTA 102 is increased, and thereby tends to cause the gain of the amplifier 70 to be decreased.

Figure 6:
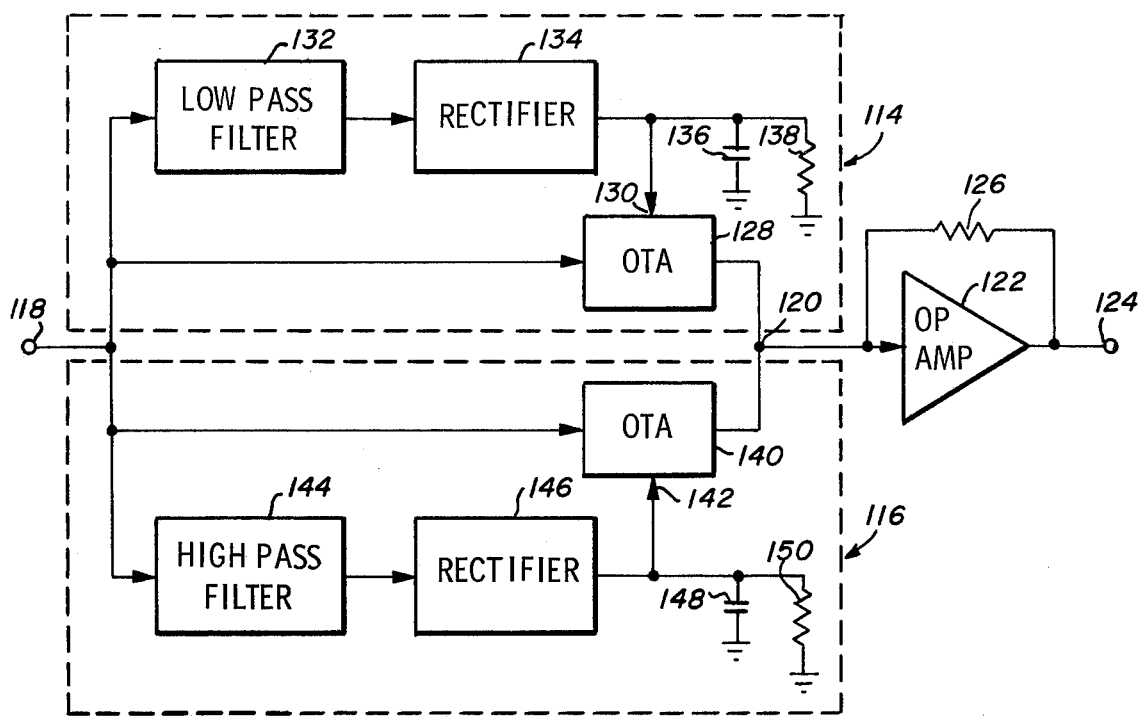
FIG. 6 is a block diagram generally illustrating an expandor circuit in accordance with the present invention.

Referring now to FIG. 6 a preferred embodiment of an expandor is illustrated and includes a low frequency band gain control circuit 114, a high frequency band gain control circuit 116, an operational amplifier 122, and a feedback resistor 126. Both the low frequency band gain control circuit 114 and the high frequency band gain control circuit 116 are connected between an input terminal 118 and the current summing terminal 120 of the operational amplifier 122. The resistor 126 is connected between the summing terminal 120 and the output terminal 124. Amplifier 122 is a high gain operational amplifier or summing amplifier. The gain of the expandor is proportional to the sum of the conductance of the low frequency band gain control circuit 114 and the conductance of the high frequency band gain circuit 116, the total being divided by the conductance of the resistor 126.

The low frequency band gain control circuit 114 includes an operational transconductance amplifier OTA 128, a low pass filter 132, a precision rectifier 134, a capacitor 136, and a resistor 138. The input of the OTA 128 is connected to an input terminal 118, and the OTA output is connected to the current summing terminal of the amplifier 120. OTA 128 also has a control terminal 130. The low pass filter 132 is connected between the input terminal 118 and the input of the precision rectifier 134. The output of the rectifier 134 is connected to the control terminal 130 of the OTA. The capacitor 136 and the resistor 138 are both connected between control terminal 130 and circuit ground.

The low pass filter 132 is a single pole device designed to pass signals having frequencies less than the filter cut-off frequency. Usually, the filter characteristics correspond to those of the compressor low pass filter 82 of FIG. 4. The time constant determined by the capacitor 136 and the resistor 138 is chosen to provide the smallest time constant compatible with the maximum distortion acceptable at the lowest frequency of operation. The filter 132 operates to filter a portion of the input signal at terminal 118 so as to pass only those signals having frequencies below its cut-off frequency. This signal is rectified by the precision rectifier 134, filtered by the capacitor 136 and applied to the control terminal 130 of the OTA 128. Thus, as the components of the input signal below the low pass filter's cut-off frequency increase, the conductance of the OTA 128 is increased, thereby tending to increase the gain of the amplifier 122.

The high frequency band gain control circuit 116 includes an OTA 140, a high pass filter 144, a precision rectifier 146, a capacitor 148, and a resistor 150. The input of the OTA 140 is connected to the input terminal 118, and the OTA output is connected to the amplifier circuit summing terminal 120. The high pass filter 144 is connected from the input terminal 118 to the input of the precision rectifier 146. The output of rectifier 146 is connected to the control terminal 142 of OTA 140.

The high pass filter 144 has characteristics similar to the high pass filter 94 used in the compressor of FIG. 4. Likewise, the time constant determined by the capacitor 148 and the resistor 150 of FIG. 6 is chosen to meet distortion criteria at the filter cut-off frequency, the same as the time constant of the capacitor 98 and the resistor 100 used in the compressor of FIG. 4. The high pass filter 144 filters a portion of the input signal at 118 so as to pass only those signals having frequencies above its cut-off frequency. This signal is rectified by the precision rectifier 146, filtered by the capacitor 148 and applied to control terminal 142 of the OTA 140. Thus, as the components of the input signal above the high pass filter's cut-off frequency increase, the conductance of the OTA 146 is increased, thereby tending to increase the gain of the amplifier 122.

Since the gain of the expandor is proportional to the sum of the conductances of the OTAs 128 and 140, which are in turn proportional to the energy passing through the low pass filter 132 and the high pass filter 144, respectively, the gain of the expandor is proportional to the input signal level at terminal 118. As the input signal level increases, so does the gain of the expandor. Thus, the output signal at terminal 124 increases more than the input signal, expanding the signal back to its original amplitude. The expandor time constant is determined by the relationship of the high frequency energy present in the signal to the low frequency energy present therein. If the signal energy is predominantly in the high frequency portion of the spectrum so as to pass mainly through the high pass filter 144, the time constant will be short. However, if the signal energy is predominantly in the low frequency end of the spectrum and passes mainly through the low pass filter 132, the time constant will be long. Although the time constant of the expandor is a function of the spectral distribution of the energy in the input signal, no filtering is used in the main signal path and thus, no filter delay or distortion is introduced into the transmitted signal by the expandor.

Figure 7:
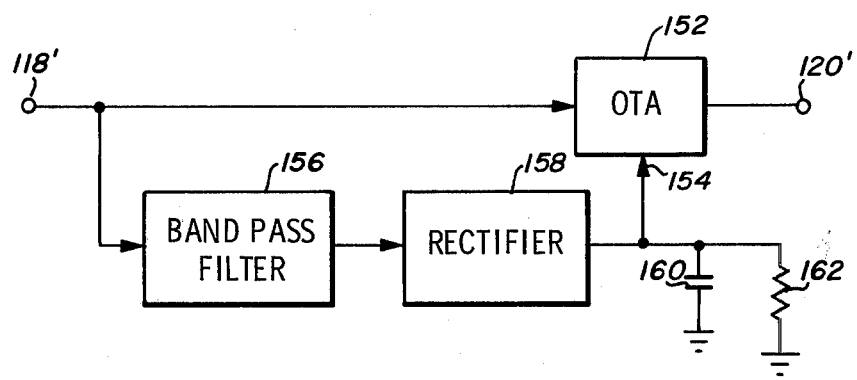
FIG. 7 is block diagram generally illustrating a medium frequency band gain control circuit for use in the expandor of FIG. 6.

FIG. 7 shows a mid-frequency band gain control sub-circuit which could be incorporated into the expandor of FIG. 6. The mid-frequency band gain control circuit includes an OTA 152, a band pass filter 156, a precision rectifier 158, a capacitor 160, and a resistor 162. The OTA 152 has its input connected to an input terminal 118', its output connected to an output terminal 120', and a control terminal 154. The band pass filter 156 is connected between the input terminal 118' and the input of the precision rectifier 158. The output of rectifier 158 is connected to the OTA control terminal 154. The capacitor 160 and the resistor 162 are each connected between the OTA control terminal 154 and circuit ground.

The band pass filter 156 is a single pole device having characteristics chosen to be similar to the band pass filter 106 of FIG. 5. Likewise, the time constant determined by the capacitor 160 and the resistor 162 is the same as the time constant determined by the capacitor 110 and the resistor 112 of FIG. 5.

The terminals 118' and 120' of FIG. 7 are connected to the terminals 118 and 120, respectively, of FIG. 6, and the cut-off frequencies of the low pass filter 132, the high pass filter 144 (of FIG. 6) and the band pass filter 156 are adjusted to provide constant level which does not vary with frequency for a constant input level. The cut-off frequencies are made the same as the ones used in the compressor of FIGS. 4 and 5. The mid-frequency circuit filters a portion of the input signal so as to pass only those signals having frequencies within its pass band. The signal passed by filter 156 is rectified by precision rectifier 158, filtered by the capacitor 160 and used to control the conductance of the OTA 152. Thus, as the components of the input signal within the pass band of the band pass filter 156 increase, the conductance of the OTA is increased, thereby increasing the gain of the amplifier 122, and thus the gain of the expandor.

Although the preceding discussion was directed toward a preferred embodiment, other configurations are contemplated. For example, the low pass filter 132 and high pass filter 144 although described as being of single pole design and connected to the input terminal 118, could be of multiple pole, low ripple design, or could have been connected to the output terminal 124 instead of the input terminal 118. Additionally, although linear multipliers or OTAs are used in the preferred embodiment, many of the numerous other methods of altering the gain of an amplifier could likewise be employed. Similar such modifications are possible for the compressor of FIG. 4. It is further contemplated that after having read the preceding disclosure other alterations and modifications of the present invention will become apparent to those skilled in the art. It is intended that the following claims be interpreted to cover all such alterations and modifications as fall within the true spirit and scope of the invention.

What is claimed is:

1. Compandor apparatus comprising:
    a signal transmission medium having a particular dynamic range;
    compressor means coupled to one end of said medium for compressing the dynamic range of an input signal to be transmitted over said medium and including,
        first gain control means for generating a first gain control signal proportional to the amplitude of said input signal over a first band of input signal frequencies, said first gain control signal having a first time constant, second gain control means for generating a second gain control signal proportional to the amplitude of said input signal over a second band of input signal frequencies, said second gain control signal having a second time constant different than said first time constant, and first amplifier means responsive to said first and second gain control signals and operative to compress the dynamic range of said input signal in accordance therewith to develop a compressed signal; and expandor means coupled to the other end of said medium for expanding the dynamic range of said compressed signal and including, third gain control means for receiving said compressed signal and for generating a third gain control signal proportional to the amplitude of said compressed signal over said first band of input signal frequencies, said third gain control signal having a third time constant substantially that of said first time constant, fourth gain control means for receiving said compressed signal and for generating a fourth gain control signal proportional to the amplitude of said compressed signal over said second band of input signal frequencies, said fourth gain control signal having a fourth time constant substantially that of said second time constant, second amplifier means responsive to said third and fourth gain control signals and operative to expand the dynamic range of said compressed signal to substantially that of said input signal.

2. Compandor apparatus as recited in claim 1 wherein said first amplifier means is an operational amplifier having gain determining input and feedback impedance elements and wherein said first and second gain control means are parallel connected first and second feedback circuits forming said feedback impedance elements.

3. Compandor apparatus as recited in claim 2 wherein said first feedback circuit includes a first operational transconductance amplifier having an input coupled to the output of said first amplifier means, an output coupled to the input of said first amplifier means, and a first control input, a low pass filter and a first rectifier connected in series between the output of said first amplifier means and said first control input, and first circuit means coupled to said first control input for determining said first time constant.

4. Compandor apparatus as recited in claim 3 wherein said second feedback circuit includes a second operational transconductance amplifier having an input coupled to the output of said first amplifier means, an output coupled to the input of said first amplifier means, and a second control input, a high pass filter and a second rectifier connected in series between the output of said first amplifier means and said second control input, and second circuit means coupled to said second control input for determining said second time constant.

5. Compandor apparatus as recited in claim 2 wherein said second amplifier means is an operational amplifier having gain determining input and feedback impedance elements and wherein said third and fourth gain control means are parallel connected first and second circuits forming said input impedance elements for coupling said compressed signal into said operational amplifier.

6. Compandor apparatus as recited in claim 5 wherein said first parallel circuit includes a first operational transconductance amplifier having a first input for receiving said compressed signal, an output coupled to the input of said operational amplifier and a first control input, a first low pass filter and a first rectifier connected in series between said first input and said first control imput, and first circuit means coupled to said first control input for determining said third time constant.

7. Compandor apparatus as recited in claim 6 wherein said second parallel circuit includes a second operational transconductance amplifier having a second input for receiving said compressed signal, an output coupled to the input of said operational amplifier and a second control input, a high pass filter and a second rectifier connected in series between said second input and said second control input, and second circuit means coupled to said second control input for determining said fourth time constant.

8. Compandor apparatus as recited in claim 1 wherein said first gain control means includes a low pass filter for limiting the operation thereof to signals falling within a first predetermined band of frequencies and wherein said second gain control means includes a high pass filter for limiting the operation thereof to signals falling within a second predetermined band of frequencies.

9. Compandor apparatus comprising:
a signal transmission medium having a particular dynamic range;
a compressor circuit coupled to one end of said medium for compressing the dynamic range of an input signal applied thereto to develop a compressed signal within said particular range for transmission over said medium and including a first operational amplifier means having a plurality of active feedback impedance circuits each responsive to signals falling within different portions of the frequency spectrum of said compressed signal, and each having a different time constant and operative to jointly control the gain of said first operational amplifier; and
an expandor circuit coupled to the other end of said medium for expanding the dynamic range of said compressed signal and including a second operational amplifier having a plurality of parallel connected active input impedance circuits each responsive to signals falling within different portions of the frequency spectrum of said compressed signal, and each having a different time constant and operative to jointly control the gain of said second operational amplifier.

10. Compandor apparatus as recited in claim 9 wherein said active feedback impedance circuits each include a first operational transconductance amplifier having an input coupled to the output of said first amplifier means, an output coupled to the input of said first amplifier means, and a first control input, a filter and rectifier connected in series between the output of said first amplifier means and said first control input, and first circuit means coupled to said first control input for determining the time constant of the particular active feedback impedance circuit.

11. Compandor apparatus as recited in claim 10 wherein said parallel connected active input impedance circuits each include an operational transconductance amplifier having a second input for receiving said compressed signal, an output coupled to the input of said second operational amplifier and a second control input, a filter and rectifier coupled in series between said second input and said second control input and second circuit means coupled to said second control input for determining the time constant of each parallel connected input impedance circuit.

12. Compandor apparatus comprising:
a signal transmission medium having a particular dynamic range;
compressor means coupled to one end of said medium for compressing the dynamic range of an input signal to be transmitted over said medium and including,
first gain control means for generating a first gain control signal proportional to the amplitude of said input signal over a first band of input signal frequencies,
second gain control means for generating a second gain control signal proportional to the amplitude of said input signal over a second band of input signal frequencies, and
first amplifier means responsive to said first and second gain control signals and operative to compress the dynamic range of said input signal in accordance therewith to develop a compressed signal, said first amplifier means including an operational amplifier having gain determining input and feedback impedance elements and wherein said first and second gain control means are parallel connected first and second feedback circuits forming said feedback impedance elements; and
expandor means coupled to the other end of said medium for expanding the dynamic range of said compressed signal and including,
third gain control means for receiving said compressed signal and for generating a third gain control signal proportional to the amplitude of said compressed signal over said first band of input signal frequencies,
fourth gain control means for receiving said compressed signal and for generating a fourth gain control signal proportional to the amplitude of said compressed signal over said second band of input signal frequencies, and
second amplifier means responsive to said third and fourth gain control signals and operative to expand the dynamic range of said compressed signal to substantially that of said input signal, said second amplifier means including an operational amplifier having gain determining input and feedback impedance elements and wherein said third and fourth gain control means are parallel connected first and second circuits forming said input impedance elements for coupling said compressed signal into said operational amplifier.

13. Compandor apparatus as recited in claim 12 wherein said first parallel circuit includes a first operational transconductance amplifier having a first input for receiving said compressed signal, an output coupled to the input of said operational amplifier and a first control input, a first low pass filter and a first rectifier connected in series between said first input and said first control input, and first circuit means coupled to said first control input for determining the time constant of said first parallel circuit.

14. Compandor apparatus as recited in claim 13 wherein said second parallel circuit includes a second operational transconductance amplifier having a second input for receiving said compressed signal, an output coupled to the input of said operational amplifier and a second control input, a high pass filter and a second rectifier connected in series between said second input and said second control input, and second circuit means coupled to said second control input for determining the time constant of said second parallel circuit.

15. Compandor apparatus comprising:
a signal transmission medium having a particular dynamic range;
a compressor circuit coupled to one end of said medium for compressing the dynamic range of an input signal applied thereto to develop a compressed signal within said particular range for transmission over said medium and including a first operational amplifier means having a plurality of active feedback impedance circuits each responsive to signals falling within different portions of the frequency spectrum of said compressed signal and operative to jointly control the gain of said first operational amplifier, said active feedback impedance circuits each including a first operational transconductance amplifier having an input coupled to the output of said first amplifier means, an output coupled to the input of said first amplifier means, and a first control input, a filter and rectifier connected in series between the output of said first amplifier means and said first control input, and first circuit means coupled to said first control input for determining the time constant of the particular active feedback impedance circuit; and
an expandor circuit coupled to the other end of said medium for expanding the dynamic range of said compressed signal and including a second operational amplifier having a plurality of parallel connected active input impedance circuits each responsive to signals falling within different portions of the frequency spectrum of said compressed signal and operative to jointly control the gain of said second operational amplifier.

16. Compandor apparatus as recited in claim 15 wherein said parallel connected active input impedance circuits each include an operational transconductance amplifier having a second input for receiving said compressed signal, an output coupled to the input of said second operational amplifier and a second control input, a filter and rectifier coupled in series between said second input and said second control input and second circuit means coupled to said second control input for determining the time constant of each parallel connected input impedance circuit.

17. Compandor apparatus comprising:
a signal transmission medium having a particular dynamic range;
compressor means coupled to one end of said medium for compressing the dynamic range of an input signal to be transmitted over said medium and including,
first gain control means for generating a first gain control signal proportional to the amplitude of said input signal over a first band of input signal frequencies,
second gain control means for generating a second gain control signal proportional to the amplitude of said input signal over a second band of input signal frequencies, and first amplifier means respnsive to said first and second gain control signals and operative to compress the dynamic range of said input signal in accordance therewith to develop a compressed signal, said first amplifier means including an operational amplifier having gain determining input and feedback impedance elements and wherein said first and second gain control means are parallel connected first and second feedback circuits forming said feedback impedance elements, said first feedback circuit including a first operational transconductance amplifier having an input coupled to the output of said first amplifier means, an output coupled to the input of said first amplifier means, and a first control input, a low pass filter and a first rectifier connected in series between the output of said first amplifier means and said first control input, and first circuit means coupled to said first control input for determining the time constant of said first gain control means; and expandor means coupled to the other end of said medium for expanding the dynamic range of said compressed signal and including, third gain control means for receiving said compressed signal and for generating a third gain control signal proportional to the amplitude of said compressed signal over said first band of input signal frequencies, fourth gain control means for receiving said compressed signal and for generating a fourth gain control signal proportional to the amplitude of said compressed signal over said second band of input signal frequencies, and second amplifier means responsive to said third and fourth gain control signals and operative to expand the dynamic range of said compressed signal to substantially that of said input signal.

18. Compandor apparatus as recited in claim 17 wherein said second feedback circuit includes a second operational transconductance amplifier having an input coupled to the output of said first amplifier means, an output coupled to the input of said first amplifier means, and a second control input, a high pass filter and a second rectifier connected in series between the output of said first amplifier means and said second control input, and second circuit means coupled to said second control input for determining the time constant of said second gain control means.

* * * * *